United States Patent [19]

Hunt et al.

[11] Patent Number: 5,044,872

[45] Date of Patent: Sep. 3, 1991

[54] SYSTEM AND METHOD FOR CHIP ORIENTATION

[75] Inventors: Ronald E. Hunt, Georgetown; Verlon E. Whitehead, Austin, both of Tex.

[73] Assignee: International Business Machines Corporation, Armonk, N.Y.

[21] Appl. No.: 520,440

[22] Filed: May 8, 1990

[51] Int. Cl.$^5$ .................... B65H 29/24; B65H 29/32
[52] U.S. Cl. ............................... 414/786; 414/755; 406/86; 406/87; 198/399; 198/380
[58] Field of Search ............. 414/754, 755, 758, 786; 198/380, 399, 400; 406/10, 12, 13, 86–88, 93, 106, 197; 221/156–159, 171; 193/44

[56] References Cited

U.S. PATENT DOCUMENTS

| | | | |
|---|---|---|---|
| 2,805,898 | 9/1957 | Willis | 406/88 |
| 3,160,443 | 12/1964 | Harris et al. | 406/86 X |
| 3,283,920 | 11/1966 | Schonfelder et al. | 406/88 X |
| 3,622,151 | 11/1971 | Range et al. | 406/87 |
| 3,874,740 | 4/1975 | Hurd | 406/87 |
| 4,135,630 | 1/1979 | Snyder et al. | |
| 4,172,513 | 10/1979 | Bradstreet et al. | 414/755 X |
| 4,801,043 | 1/1989 | Cindric | 198/399 X |
| 4,840,697 | 6/1989 | Goodfellow et al. | 414/755 X |
| 4,960,360 | 10/1990 | Giannuzzi et al. | 198/380 X |

*Primary Examiner*—David A. Bucci
*Assistant Examiner*—Brian Dinicola
*Attorney, Agent, or Firm*—R. M. Carwell

[57] ABSTRACT

A queue of randomly oriented chips is advanced down a track. Each chip in the queue is sequentially and individually elevated into a pneumatic circuit and pressed against a mirrored surface of an upper slide member to which it adheres if the chip was oriented with upwardly disposed solder lands. A jet of compressible fluid insufficient in magnitude to dislodge the chip is injected in a direction toward the queue. If the chip, alternatively, was oriented with the solder lands down, this fluid jet propels the chip about the oval-shaped pneumatic circuit so as to reorient the chip with the lands extending in the desired upward orientation, whereupon the chip is injected into a storage magazine. If the chip was adhered to the mirrored surface, after the first fluid jet, a second fluid jet is introduced to dislodge the correctly oriented chip from the mirrored surface, whereupon a third fluid jet oriented in a direction opposite to that of the first jet and in the direction of the advancing queue, propels the correctly oriented chip along a passageway to the storage magazine. This passageway joins with the oval-shaped inverting passageway which was employed to reorient or flip incorrectly disposed chips as they traversed the reorienting oval.

7 Claims, 9 Drawing Sheets

# SYSTEM AND METHOD FOR CHIP ORIENTATION

RELATED PATENT APPLICATIONS

This patent application is related to U.S. patent application Ser. No. 07/347,691, now U.S. Pat. No. 4,974,390, filed May 5, 1989, entitled "System and Method for Loading Electronic Component Carrier Tubes", which is incorporated herein by reference.

TECHNICAL FIELD

This invention relates to automated electronic component placement machines and, more particularly, relates to methods and apparatus for correctly orienting leadless chips in uniform orientations for loading into carrier tubes.

BACKGROUND ART

In the evolution of modern electronic manufacturing art the long established trend has been toward smaller components and more dense packaging made possible by these components and development of sophisticated circuitizing techniques employing laser technology and the like. Yet an additional trend in order to continue favorable improvements in manufacturing cost reductions has been away from hand work and toward increasingly sophisticated automated assembly techniques. Representative of this are automatic component placement machines such as those depicted in U.S. Pat. No. 4,135,630 and machines such as those manufactured by the Dynapert Corporation Universal Instruments Company, and Panasonic. These machines employ robotics-type techniques to automatically place various pin-in-hole surface mount or other components, on substrates or circuit boards as desired.

Whereas the current state of the art with respect to such automated placement devices is predominantly of the type wherein single components are place sequentially, effort is currently being made to advance the art further by means of machines capable of placing a plurality of components simultaneously. One example of such a machine is provided by Panasonic National, details of a representative system thereof being set forth in a publication entitled "Specifications: Panasert Simultaneous Chip Component Placement Machine Model No. NM-8270". As the art continues to develop, tremendous manufacturing throughput capability thereby results wherein it becomes possible to place large numbers of components on boards at extremely rapid rates.

One very serious problem with such tremendous throughput is in feeding components to the machines for automated placement in a form which may readily be used by the particular machine. One technique for attempting to solve the problem has been to place the components on a tape for tape feeding. However with the advent of simultaneous component placement equipment and the increasingly smaller dimensions of the various components, techniques such as those disclosed in the aforementioned Panasonic machine are beginning to be employed wherein components are loaded or stacked vertically in carrier tubes for use by the machines.

Notwithstanding improved packaging techniques for storing components and delivering them to the machines such as the tubes just mentioned, a serious problem remains in how to package such components in tubes in a rapid, economical and yet reliable fashion. The urgent need for a quick and efficient means to effect such packaging may be understood when it is considered that with the increasing costs of such sophisticated placement machinery, down time while awaiting a supply of appropriately configured chips is prohibitively expensive and unacceptable.

However, lack of available equipment for quickly, economically and reliably loading tubes with increasingly smaller and smaller components has seriously impeded progress toward adoption of simultaneous placement and other techniques for substantially improving manufacturing throughput. Numerous difficult problems are associated with providing such tube loading machinery which are not readily apparent. First, due to the extremely minute size of such components placing hundreds of such minute components in a tube in a uniform orientation is non-trivial. With respect to the components themselves, for example, the industry has been plagued with inability to consistently align such small components repeatedly due to innumerable factors including the tendency of components to stick together, and chip dimensional variations arising from non-uniformity in manufacture, broken components, and the like.

Reliably and consistency in placing a vast, uniform number of such minute components in exactly the same orientation within tubes and insuring the integrity of each such component is extremely important. This may be appreciated when it is considered that with the incredible throughput provided by simultaneous placement machines, numerous boards could be populated with chips which were defective or disoriented long before the error was detected in a manufacturing line. This results in extremely expensive waste material or rework cost. Such errors could be caused not only by broken chips loaded into the tubes, but even in some instances by inverted chips having contact pads on only one side which must be consistently loaded with these pads oriented in the same way.

Yet another example of the need for 100% accuracy in tube loading is that with dissimilar numbers of components in the various tubes used on a placement machine, numerous boards could be populated with missing components due to tubes having a substandard number of such components running out of chips prior to the other tubes.

One attempt to provide an automated chip loading machine employs a vibratory bowl technique used in the handling of small parts such as screws or the like. In operation this machine provides a helical path down which chips are vibrated from a reservoir until they are somewhat uniformly aligned for subsequent placement in a tube. Numerous drawbacks to such an approach result in the industry still being in need of an effective solution to the component tube filling problem. One serious and immediately apparent drawback is that the machine is adapted to only load single tubes at a time. A large number of such expensive machines is thereby necessitated to hope to even attempt to keep up with the vastly increasing throughput of simultaneous component placement machines as aforesaid. Yet additional serious drawbacks of this machine include lack of visibility of the loading process, difficulty in purging the machine and changeover to begin loading a different component, and failure to provide for detection of dimensional or functional irregularities in the chips.

With the foregoing in mind, it is apparent that a component tube loading machine was desperately needed in the industry which could provide for the consistent loading of various components in tubes wherein the machine was extremely reliable and, had a substantial throughput to enable the tube filling task to keep pace with the throughput of placement machines. Such a machine was also urgently needed which could provide for the loading of a plurality of tubes simultaneously, and which further provided for ease of purging when it was desired to fill tubes with a different component. Still further a component loader was sought which provided ease of visibility of the progress of the components during the loading process, and which further prevented loading tubes with non-uniform components. Yet further features desirable in such a machine were the ability to rapidly change over so as to begin filling another set of tubes and to further do so with a completely different component. These and other desirable features are provided by the subject invention which overcomes the hereinbefore described problems of the prior art.

One problem with the aforementioned carrier tube loading machine disclosed in the aforementioned U.S. patent application Ser. No. 07/347,691, now U.S. Pat. No. 4,974,390, is related to the nature of many of the chips employed in modern electronic circuits. Many of these chips, predominantly of the passive component variety, are provided in the form of a minute rectangular shape having solder lands disposed at opposing ends thereof. However, these solder lands may only appear on one face of the component. Accordingly, it is essential that a mechanism be provided for loading such components into tubes in a consistent orientation with the solder land faces of all such chips in the tube being oriented in the same direction. The reason for this relates to the operation of modern chip placement machines employing these tubes of components. The placement machines will take the chips from the tubes and dispose them with the solder lands facing downward so as to cause the solder lands of the chips to matingly engage corresponding solder lands or pads on the receiving substrate, mother board or the like. Inasmuch as the placement apparatus typically is not provided with means for sensing the orientation of chips as they are expelled from the tube, it is essential that all such components be oriented consistently within the tube. However, due to the extremely minute dimensions of such chips it is extremely difficult to provide for a reliable and inexpensive system and method for consistently orienting such chips in carrier tubes.

This problem is further compounded by the extremely rapid throughput being achieved by modern simultaneous component placement machines which are capable of placing such components at rates in excess of 200-300 components per minute. It may thus be seen that to properly utilize this throughput capacity of the placement machines themselves, it was imperative to devise a tube stuffing machine which could keep up with this throughput in providing magazines or carrier tubes of such chips which were properly oriented.

The present invention has solved this troublesome problem in providing for a reliable, simple and inexpensive means for establishing proper orientation of chips prior to loading in carrier tubes, such invention being further described in greater detail herein and with reference to the accompanying drawings.

SUMMARY OF THE INVENTION

A queue of randomly oriented chips is advanced down a track. Each chip in the queue is sequentially and individually elevated into a pneumatic circuit and pressed against a mirrored surface of an upper slide member to which it adheres if the chip was oriented with upwardly disposed solder lands. A jet of compressible fluid insufficient in magnitude to dislodge the chip is injected in a direction toward the queue. If the chip, alternatively, was oriented with the solder lands down, this fluid jet propels the chip about the oval-shaped pneumatic circuit so as to reorient the chip with the lands extending in the desired upward orientation, whereupon the chip is injected into a storage magazine. If the chip was adhered to the mirrored surface, after the first fluid jet, a second fluid jet is introduced to dislodge the correctly oriented chip from the mirrored surface, whereupon a third fluid jet oriented in a direction opposite to that of the first jet and in the direction of the advancing queue, propels the correctly oriented chip along a passageway to the storage magazine. This passageway joins with the oval-shaped inverting passageway which was employed to reorient or flip incorrectly disposed chips as they traversed the reorienting oval.

BRIEF DESCRIPTION OF THE DRAWING

The novel features believed to be characteristic of the invention are set forth in the appended claims. The invention itself, however, as well as other features and advantages thereof, will be best understood by reference to the following description of the preferred embodiment, when read in conjunction with the accompanying figures, wherein:

BEST MODE FOR CARRYING OUT THE INVENTION

Figure 1:
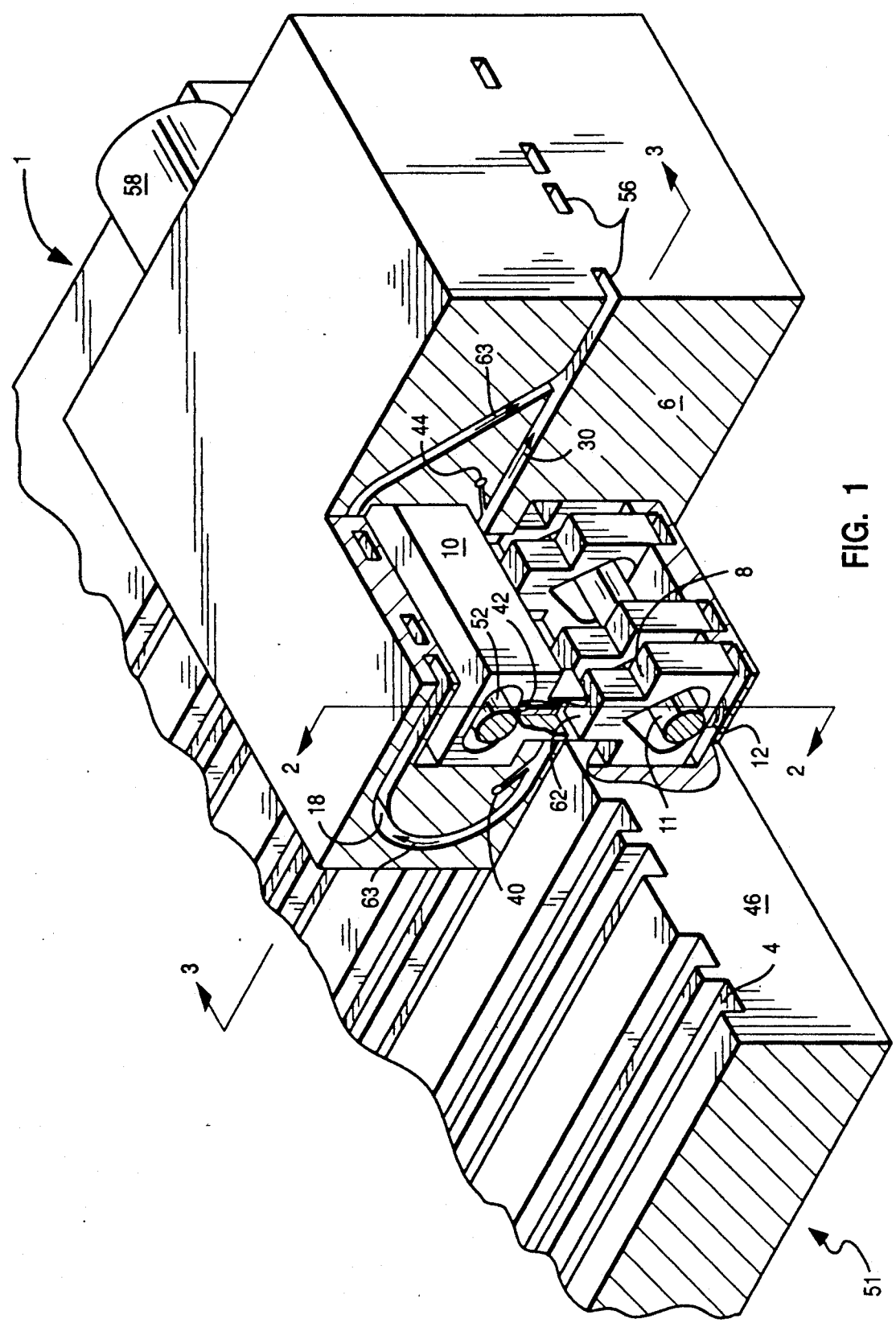
FIG. 1 is a pictorial view, partially in section, depicting a lowermost end of a carrier tube loading machine including the chip orientation apparatus of the present invention.
Figure 3:
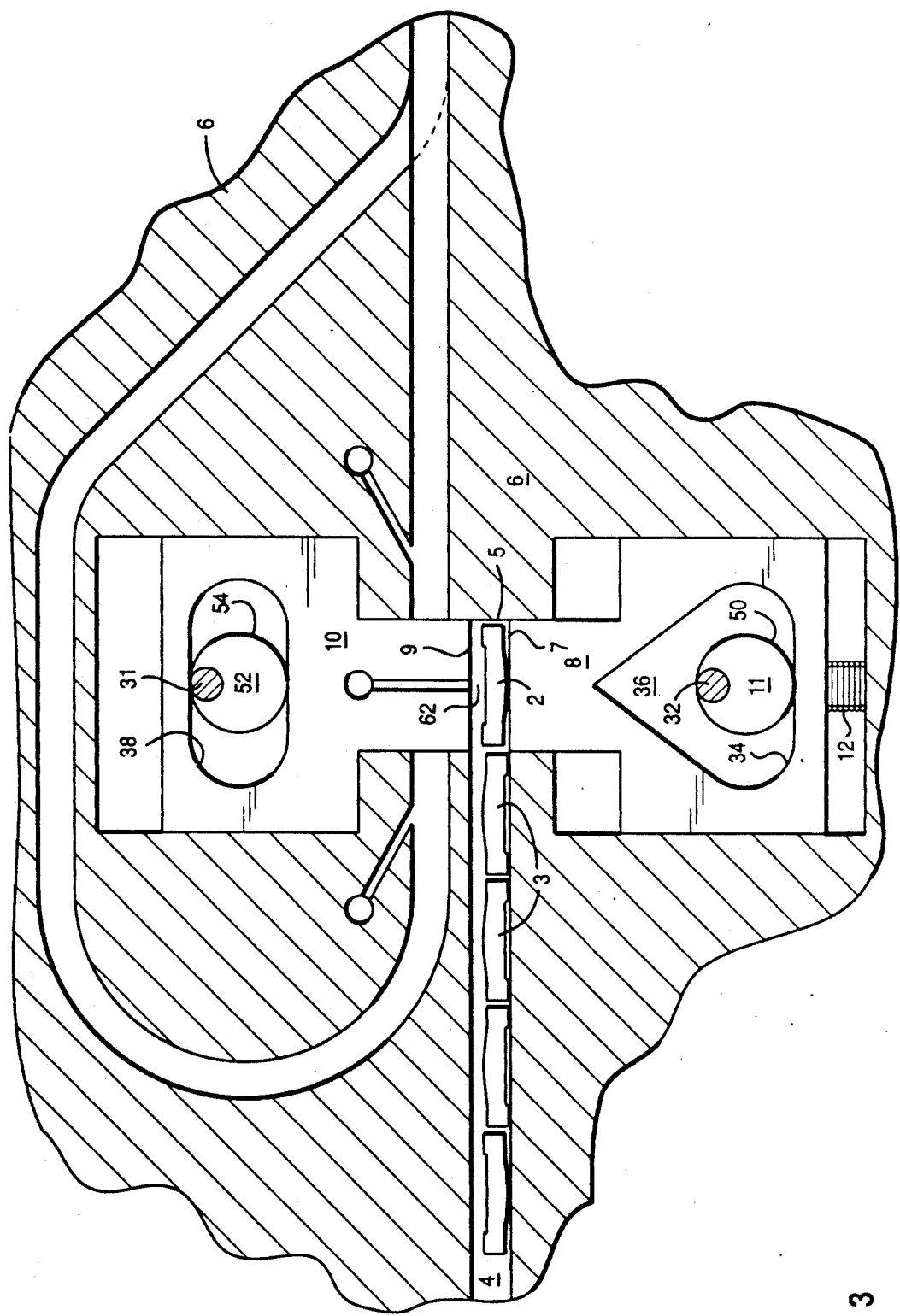
FIG. 3 is an elevational view in section of yet another portion of the chip orientation apparatus depicted in FIG. 1 taken along 3—3.

Referring first to FIG. 1 a portion of a component loader 51 is depicted therein including the chip orientation apparatus 1 of the present invention. Reference to the hereinbefore noted U.S. patent application Ser. No. 07/347,691, now U.S. Pat. No. 4,974,390, which is incorporated herein by reference, provides the details by which a queue of chips such as chips 2, 3 of FIG. 3 are established in a plurality of tracks 4 and caused to advance down the tracks to the right in FIG. 1 as a result of gravity feed and vibratory motion. The chips typically include a ceramic or other body and a pair of conductive solder lands on opposing ends carried on one face of the body. The component loader 51 disclosed in the aforementioned patent application receives chips disposed in a hopper in a random orientation which are then introduced into the tracks. Accordingly, as the chips advance down the track 4 some of the chips (such as chip 2, FIG. 4) will be oriented in the track 4 with solder lands 13, 14 disposed in an upward-facing direction. However, other chips (such as chip 3, FIG. 4) will be oriented in the track with the lands 13, 14 facing downward. For hereinbefore noted reasons, it was thus necessary to perform the function of consistently orienting all chips, this function being performed by the chip orientation apparatus 1 of the invention.

First a general description of the various components of the orientation apparatus 1 will be provided, followed by a description with reference to FIGS. 3-6 of the sequence of operation of the apparatus for expelling chips with the lands 13, 14 facing upward. This, in turn, will be followed by a detailed description, with reference to FIGS. 7-9 of the sequence of operation of the apparatus 1 in reorienting and expelling chips into the carrier tubes with an initial downward facing solder land presentation in the tracks 4.

Accordingly, now referring to FIG. 1 in more detail, a housing block 6 is provided which encloses a plurality of lower slide members 8 and an upper slide member 10. These members 8-10 are urged upwardly and downwardly in a manner to be hereinafter described in greater detail by means of a cam drive 58 which rotates an upper cam 52 and lower cam 11 which co-act against upper and lower members 10 and 8, respectively.

Figure 2:
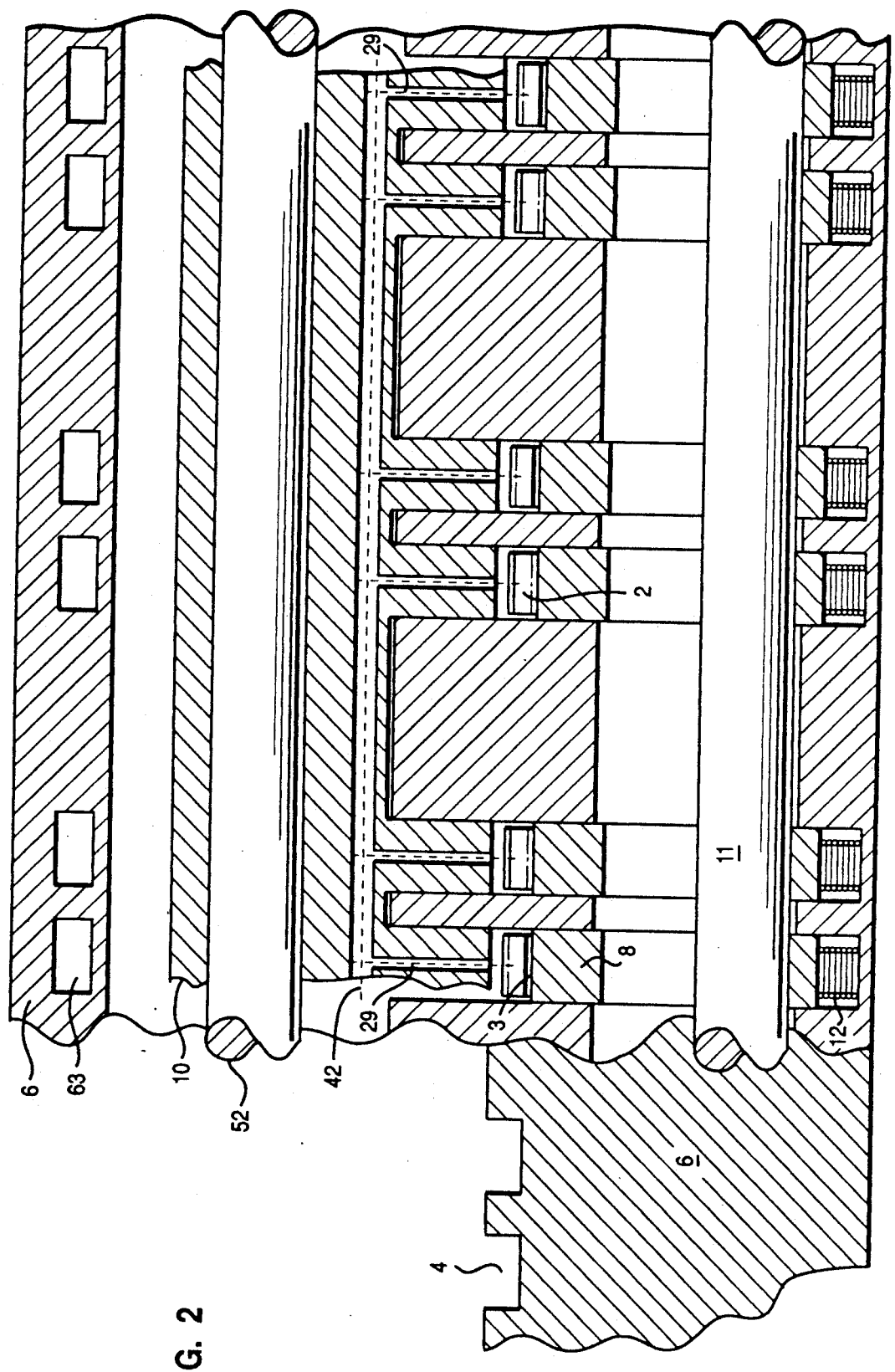
FIG. 2 is an elevational view of a portion of the chip orientation apparatus of FIG. 1 taken along line 2—2.

A rear, central and front manifold 40, 42 and 44, respectively, extend through the block 6 in a direction transversely to the tracks 4. The center manifold 42, for example, may be seen more clearly as extending through the block 6 with reference to FIG. 2, which is a cross-section of the orientation apparatus 1 taken along 2—2. As each individual chip traverses the track 4 and is introduced into the general area referred to herein as the throat 62, the manifolds 40-44 will be energized with a compressible fluid sequentially in a manner to be described in greater detail. The chip will be expelled along chip outlet 56 in the direction of arrow 30 if its solder lands were oriented upwards when it was introduced into the throat 62. Alternatively, if the lands of the chip were extending downward when in the throat 62, proper operation of the aforesaid manifolds will project the chip through an inverting track 18 in the direction of arrow 63. As the chip progresses through this inverting track 18, it will, thus, be flipped over or reoriented 180 degrees so as to locate its solder lands in the desired orientation facing upwards when it is then further ejected through the chip outlet 56 and into awaiting carrier tubes. For purposes of clarity, carrier tubes into which the chips are loaded are not shown, nor is the magazine for carrying a plurality of such tubes shown, although they would conventionally be placed adjacent the chip outlet 56 and provided with mechanisms for moving the thus correctly oriented chips downwardly into the awaiting carrier tubes.

Referring now to FIGS. 3-6, the sequence of operation of the orientation apparatus 1 will now be described for chips such as chip 2 with the lands oriented upwardmost. First, with reference to FIG. 3, as the chip 2 is introduced into the throat 62, the lower cam 11 will rotate by means of the cam drive 58 (FIG. 1) 180 degrees to the position shown in FIG. 4, such rotation occurring about lower cam pivot shaft 32. As the lower cam outer surface 50 slides along the lower slide member inner surface 34 during rotation, the spring 12 urges the lower slide member 8 upward to the position shown in FIG. 4 wherein the lands 13 and 14 of chip 2 are pressed against a downward facing lower polished chip carrier surface 9 of upper slide member 10. This surface 9 is a 2 microfinish surface presenting a mirrored appearance. It is a feature of the invention that the surface 9 is polished to a degree whereby solder lands of chips will adhere thereto so that the chips are suspended from this surface 9. The spring 12 provides an approximate two pound clamping force. The spring is selected so as to provide a sufficient force to cause a macroscopic adhesion between the chip lands 13, 14 and the polished surface 9. In this manner, the chip 2 may actually be supported by the upper slide member 10 when support being provided by the upward facing chip support surface 7 of lower slide member 9 is withdrawn, as will be seen.

Figure 4:
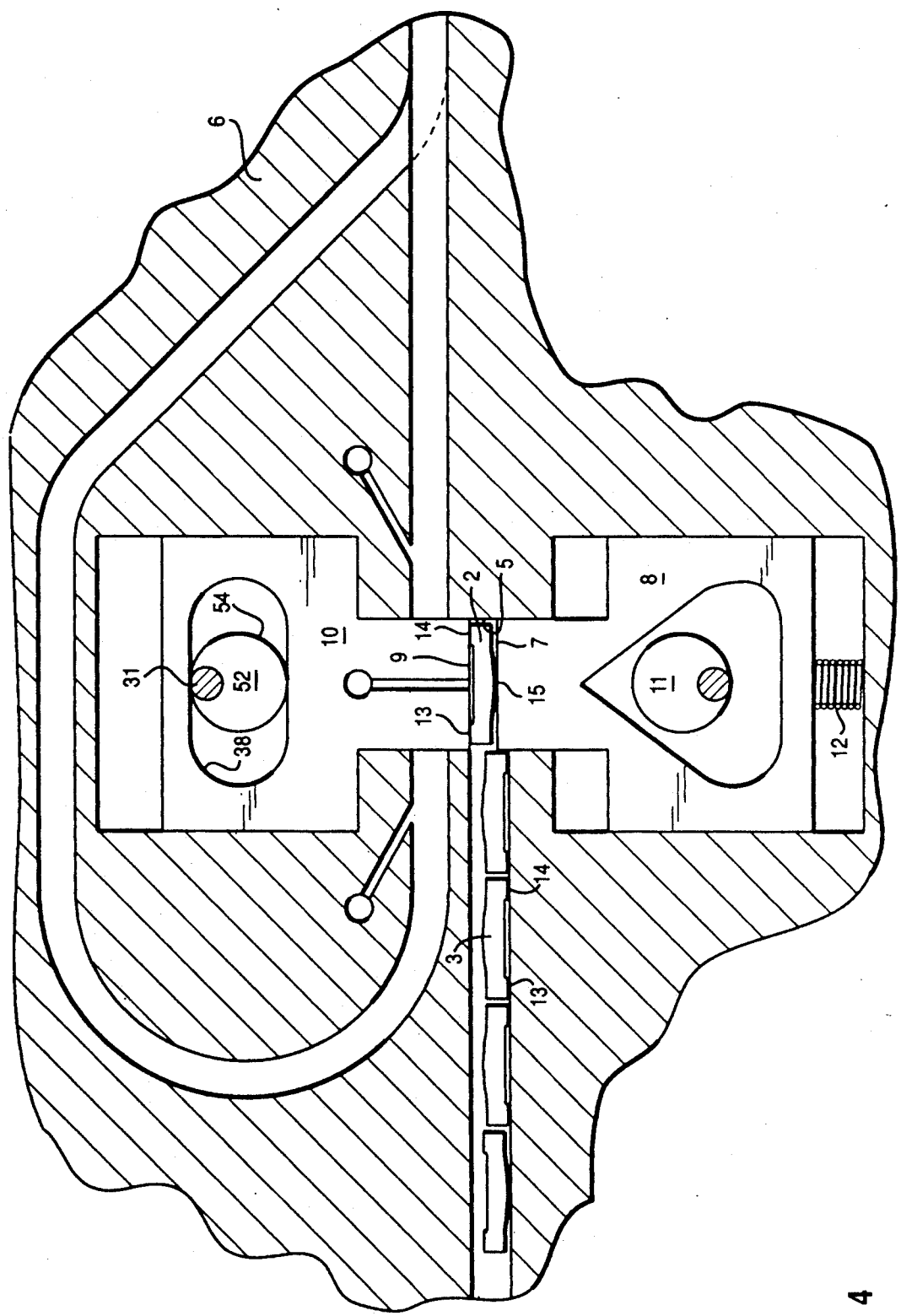
FIGS. 4-6 are a series of sectioned elevational views of the chip orientation apparatus depicted in FIG. 1 taken along line 3—3 illustrating the sequence of operation of the apparatus in processing a chip oriented with upwardly disposed solder lands.
Figure 5:
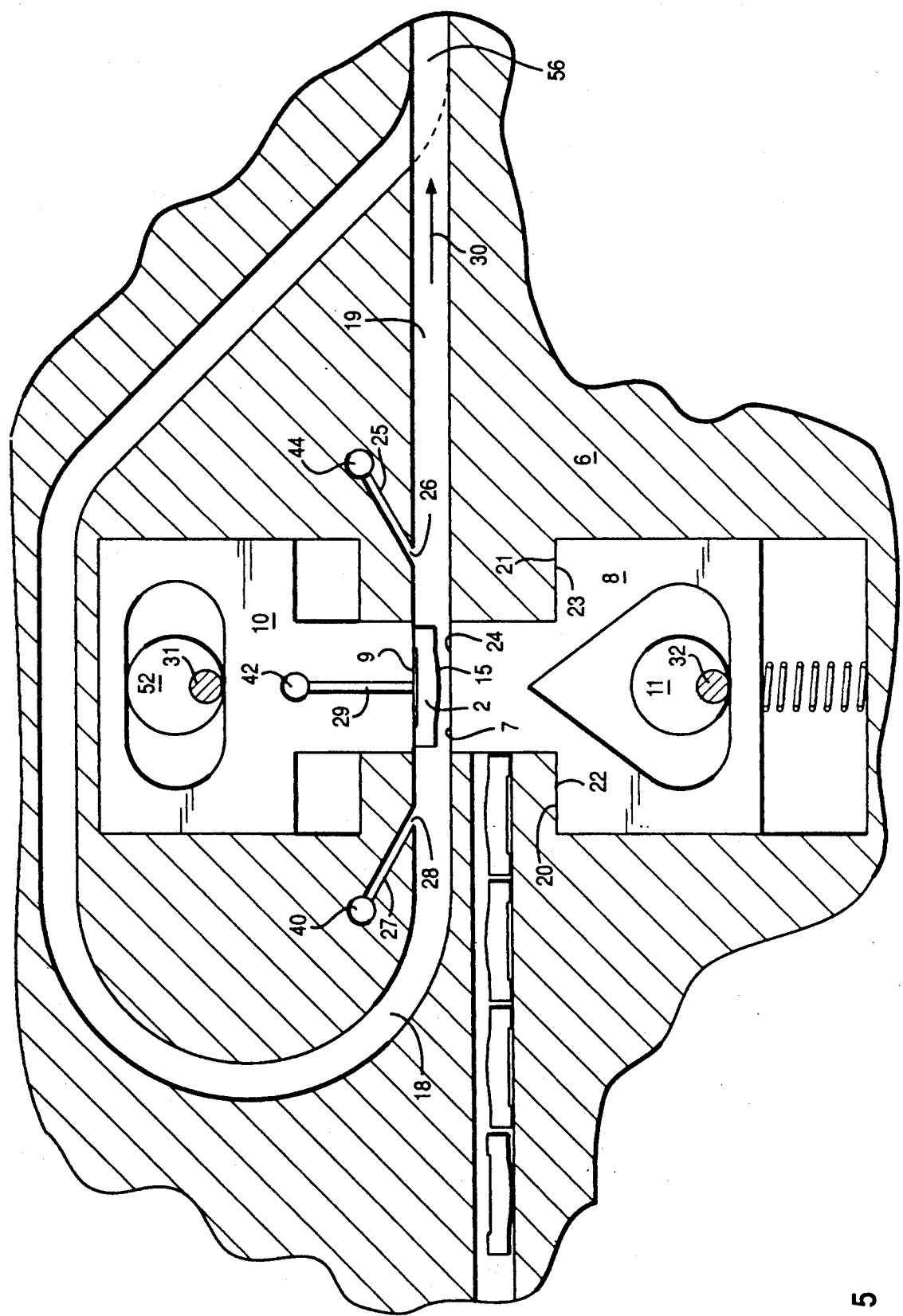

At this point, in FIG. 4, the upper cam 52 will be urged in rotational motion by the cam drive 58 180 degrees to the position shown in FIG. 5 by means of rotation of the upper cam pivot shaft 31. The upper cam outer surface 54 co-acting against the upper slide member inner cam follower surface will urge the upper slide member 10 from the position shown in FIG. 4 to that of FIG. 5 wherein the chip 2, due to the aforementioned adhesion of the lands to the polished surface, may now be seen to be pendantly suspended from the upper slide member 10, as indicated by the presence of the air gap 24.

Still referring to FIG. 5, with respect to each track 4 an inverting track 18 will be disposed internally of the block 6. A front tube 25 will provide fluid communication between the front manifold 44 and each such inverting track 18. Similarly, a chip detach tube 29 will provide fluid intercommunication between the center manifold 42 and each inverting track 18. Still further, a rear nozzle opening 28 will, in like manner, be provided for effecting fluid intercommunication between the rear manifold 40 and each inverting track 18. With the lower and upper slide members 8 and 10, respectively, in the positions shown in FIG. 5, the front manifold 44 will thence be energized with a source of fluid pressure of sufficient magnitude to propel a chip about the inverting track 18 if it was not in a position with the lands adhering to the upper slide member 10. Such motion will be described in greater detail with reference to the sequence of FIGS. 7-9, wherein it may be clearly seen that the chip 2 is in this alternate configuration with the solder lands facing downward. Although the amount of pressure provided in the front manifold 44 is sufficient to propel a chip which was not adhering to the upper slide member 10 about the inverting track 18 and out the chip outlet 56, this pressure will be selected so as to not be sufficient to dislodge a chip such as chip 2 in FIG. 5 from member 10 which is, in fact, adhering to the upper slide member s polished surface.

Figure 6:
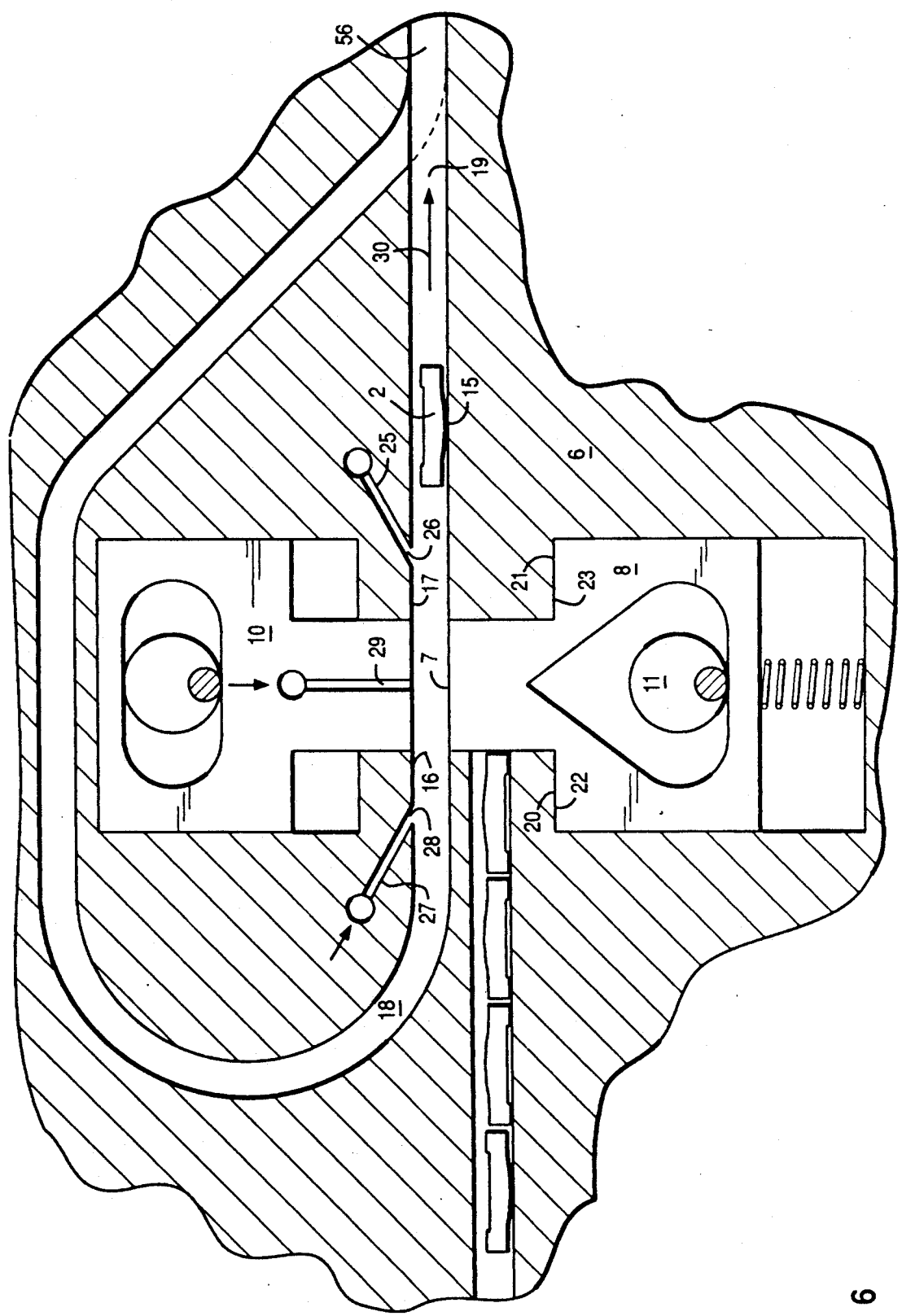

Once this pressure has been injected in the front manifold 44 and discontinued, next a fluid pressure will be introduced into the center manifold 42, which will communicate fluid pressure down the respective chip detach tubes 29 associated with each inverting track 18 so as to break the seal of chip 2 to the surface 9. Next, rear manifold 40 will be energized by a source of fluid pressure communicated through each rear tube 27 to its respective inverting track 18. As shown in FIG. 6, this pressure from rear tube 27 will be sufficient to propel the chip 2 in the direction of arrow 30 along the non-inverting track 19 and out the chip outlet 56.

It will be noted in comparison of FIGS. 4 and 5 that a stop surface 5 is provided in the block 6 for each track so that when the chips are urged along their respective tracks and into their respective throats 62, this stop surface 5 will prevent further horizontal movement of the chips. Still further, comparison of FIGS. 4-5 will also reveal that the block is fashioned so as to provide a plurality of shoulder stops 22-23 which will inhibit continued upward urging of the slide members 8 by the springs 12 when shoulder surfaces 20-21 of the lower slide members 8 abut into mating engagement with their respective shoulder stops 22-23. It will be readily apparent that continued rotation in an additional 180 degrees by the upper and lower cams 52 and 11 about their respective upper cam pivot shaft 31 and lower cam pivot shaft 32 will cause the lower and upper slide members 8 and 10 to thence return to the position shown in FIGS. 3 and 7, whereupon additional sequential movement of the chips along the tracks will cause a next chip to be introduced into the throats 62.

Figure 7:
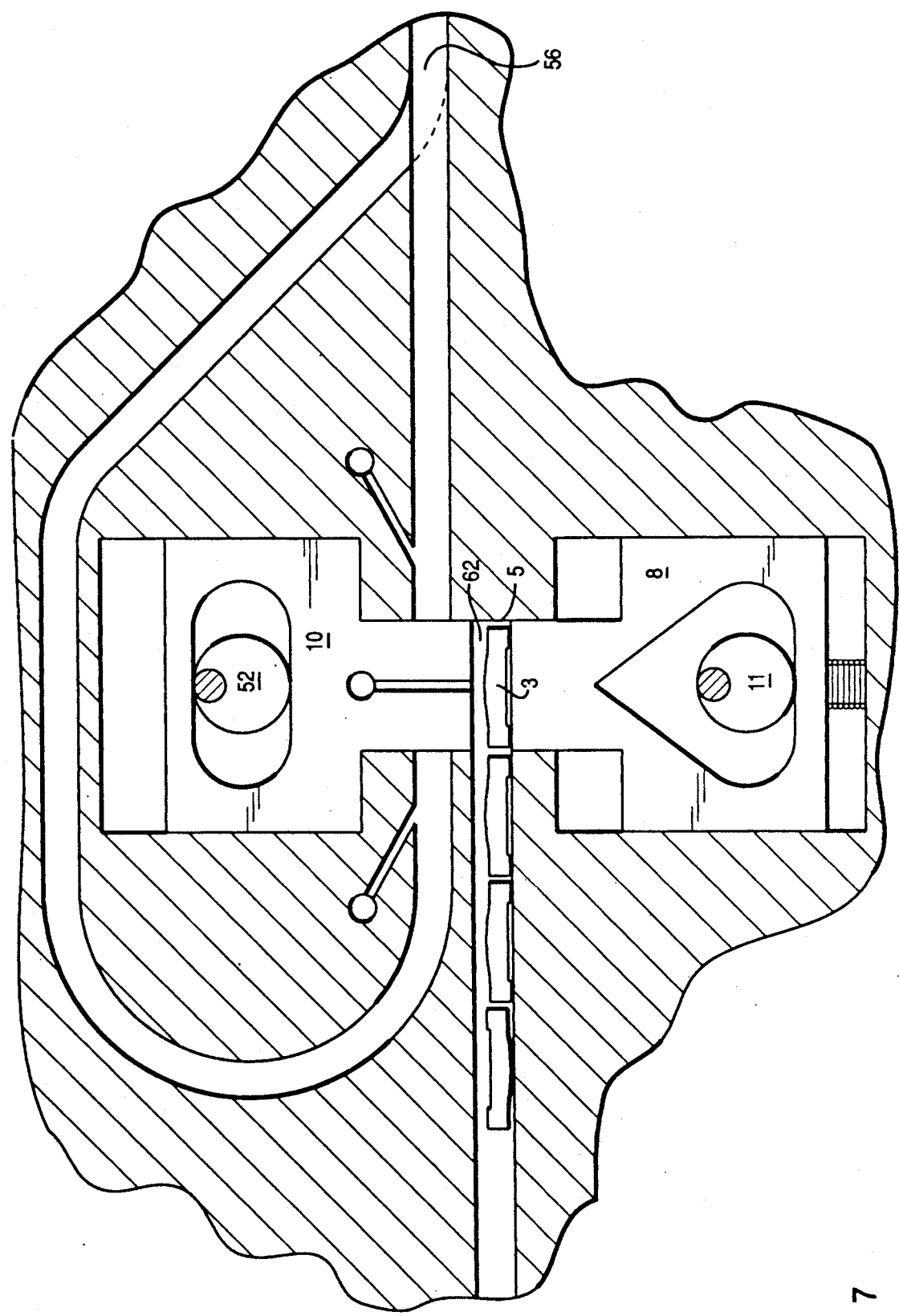
FIG. 7-9 are a series of sectioned elevational views of the chip orientation apparatus depicted in FIG. 1 taken along line 3—3 illustrating the sequence of operation of the apparatus in reorienting a chip disposed with downward facing solder lands 180 degrees prior to expulsion into the carrier tube.
Figure 8:
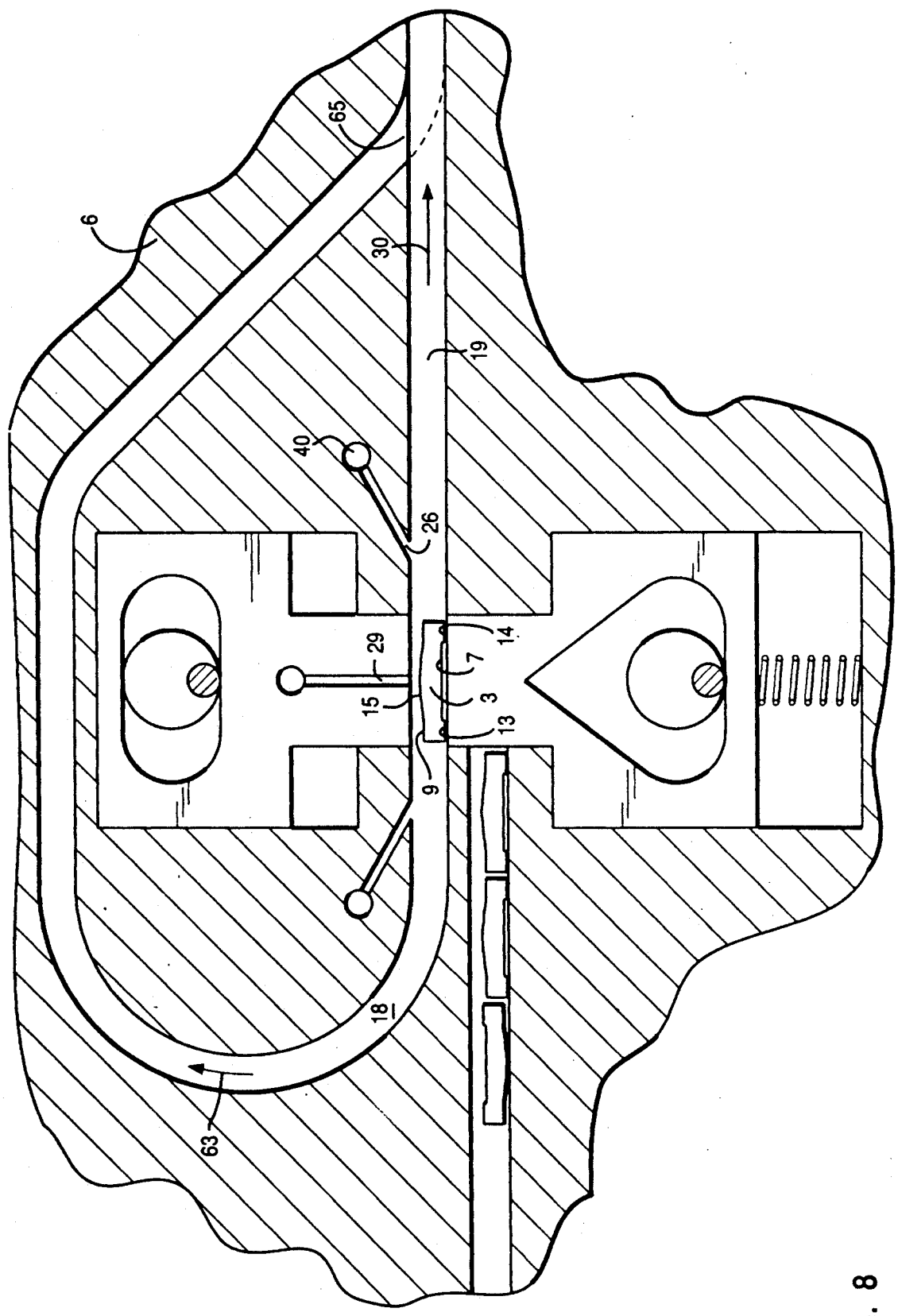
Figure 9:
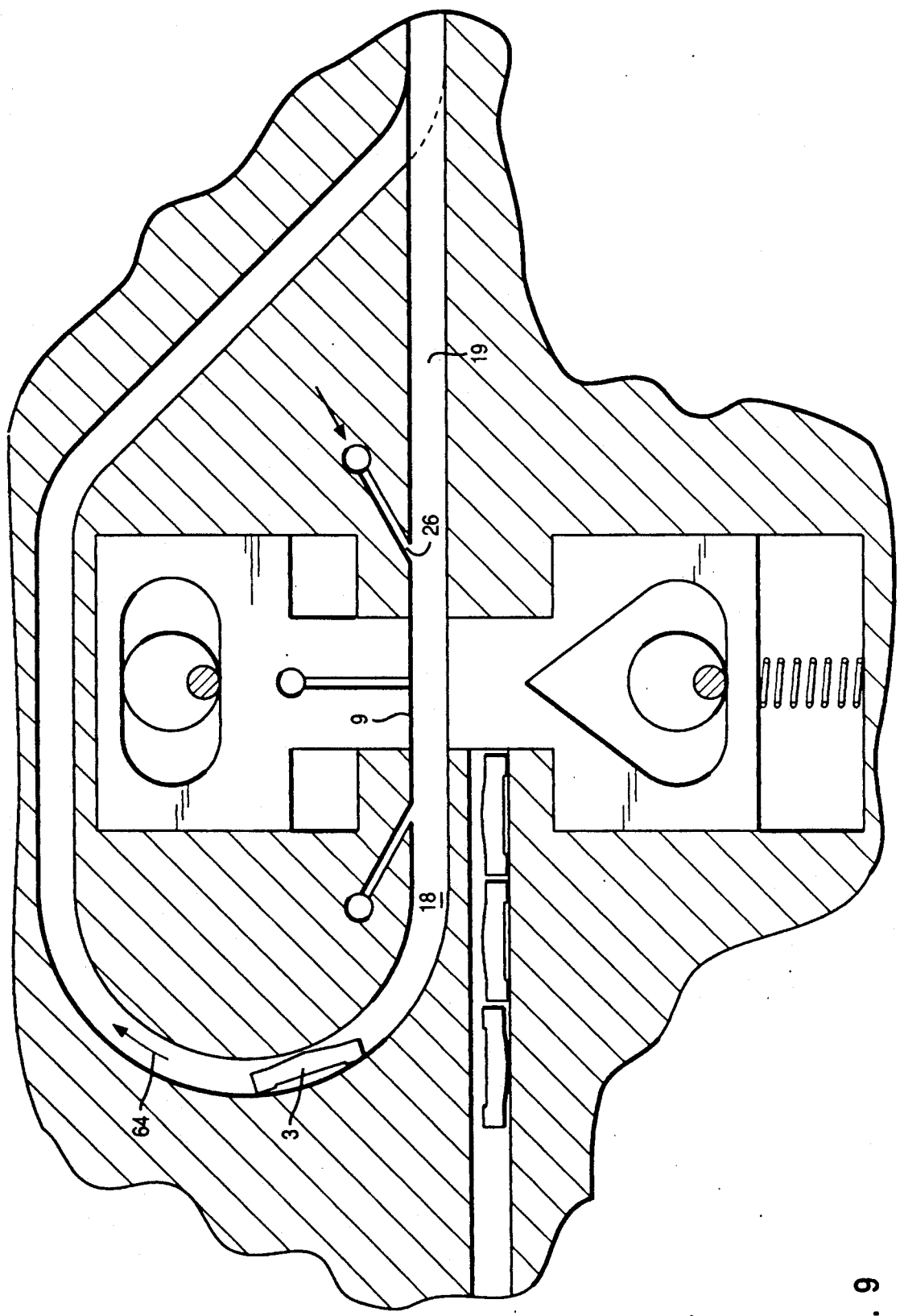

Referring now to FIGS. 7-9, these figures depict a sequential movement of a chip in like manner to that of FIGS. 3-6 in a generally upward direction and thence outwards of the chip outlet 56. However, a close inspection of the chip 2 being so moved reveals that the main difference between the first drawing sequence of FIGS. 3-6 and the second sequence of FIGS. 7-9 is that in this latter sequence, the chip 2 happens to have been one which was introduced into the throat 62 with its lands facing in a generally downward direction. Rotation of the lower and upper cams 11 and 52, with reference to FIGS. 3-5, will be identical with reference to FIGS. 7-8 in causing the lower and upper slide members 8 and 10, respectively, to move from the positions shown in FIG. 7 to that of FIG. 8. The difference is that a comparison of FIGS. 5 and 8, with these lower and upper slide members 8 and 10 in similar positions, indicates that unlike in the case of the chip 2 in FIG. 5, the chip 3 of FIG. 8 is not adhering to and pendantly disposed from the polished surface of the upper slide member 10 due to the fact that the solder lands are facing downward. On the contrary, it is supported by support surface 7 of lower slide member 8.

The sequential energization of the rear, center and front manifolds 40, 42 and 44, respectively, will now transpire, as in the case of the description relating to the FIGS. 3-6. However, it will be recalled that the fluid pressure introduced into the rear manifold 40, while not sufficient to dislodge a chip 2 adhering to the upper slide member 10, will be sufficient to cause chips with downwardly facing solder lands to traverse about the inverting track 18. This movement may be clearly seen with reference to FIG. 9, wherein the chip 3 is in the process of being inverted 180 degrees as it traverses about the inverting track 18 in the direction of arrow 64.

Briefly referring back to FIG. 8, it will be noted that each inverting track 18 will be disposed within the housing block 6 in a manner so as to cause the non-inverting track 19 to join the inverting track 18 at location 65, and, thus, be in fluid communication therewith. In this manner, with reference to FIG. 1, a chip may exit the identical chip outlet 56 regardless of whether it traverses the non-inverting track 19 in the direction of arrow 30, or traverses the inverting track 18 in the direction of arrow 63, the difference being that if it traverses the inverting track 18 before exiting chip outlet 56 it is reoriented 180 degrees or flipped. It will be noted that with reference to FIG. 9, once the chip 3 is traversing the inverting track 18, the center and front manifolds 42 and 44 may, nevertheless, be energized sequentially in the identical manner to that of FIGS. 3-6, simply having no effect in that the chip will have, nevertheless, traversed the inverting track 18 as desired and be expelled through the chip outlet 56. It will be readily appreciated that appropriate fluid pressure sources may be provided for the manifolds 40-44, as well as appropriate valves and timing circuits as well known in the art to effect the desired sequential delivery of appropriate fluid pressures thereto.

We claim:

1. Method for orienting components in a chip orienting apparatus, comprising
    supporting a first of said components in a passageway in an initial first orientation from below said first component;
    injecting a first pressurized fluid jet into said passageway to re-orient said component 180 degrees from said first orientation relative to a horizontal line transverse to the direction of travel of said first component within said passageway;
    supporting a second of said components in said passageway in a second orientation from above said second component; and
    injecting a second pressurized fluid jet into said passageway to expel said component from said passageway in said second orientation.

2. The method of claim 1 wherein said support from above comprises suspending said second component by adhesive contact with an upper surface of said second component.

3. The method of claim 2 wherein said step of suspending said second component by adhesive contact comprises establishing a polished surface in said apparatus and pressing said chip against said surface with a magnitude in an amount sufficient to effect said adhesion.

4. The method of claim 1 wherein said apparatus includes an inverting passageway and a non-inverting passageway in fluid communication with said inverting passageway; and wherein said method further comprises directing said first component through said inverting passageway with said first pressurized jet; and directing said second component through said non-inverting passageway with said second pressurized jet.

5. The method of claim 4 wherein said apparatus further includes a chip outlet in fluid communication with said inverting and said non-inverting passageways: and wherein said method further includes ejecting said first and second components from said inverting and non-inverting passageways, respectively, through said chip outlet.

6. The method of claim 1 further including injecting a third pressurized fluid into said passageway to detach said second component from said support.

7. The method of claim 1 wherein said third fluid jet occurs prior to said second fluid jet.

* * * * *